United States Patent [19]

Arai

[11] Patent Number: 4,842,992
[45] Date of Patent: Jun. 27, 1989

[54] METHOD OF TREATING PHOTORESISTS

[75] Inventor: Tetsuji Arai, Yokohama, Japan

[73] Assignee: Ushio Denki, Tokyo, Japan

[21] Appl. No.: 195,415

[22] Filed: May 12, 1988

Related U.S. Application Data

[63] Continuation of Ser. No. 923,505, Oct. 27, 1986, abandoned.

[30] Foreign Application Priority Data

Mar. 17, 1986 [JP] Japan .................................. 61-56979

[51] Int. Cl.$^4$ .............................................. G03C 5/36
[52] U.S. Cl. .................................... 430/328; 430/330
[58] Field of Search ............... 430/311, 325, 326, 328, 430/330

[56] References Cited

U.S. PATENT DOCUMENTS 4,548,688 10/1985 Matthews ....................... 204/159.18

OTHER PUBLICATIONS

Moran et al., Fundamentals of Physical Chemistry, MacMillan Publishing Co., New York, 1974, pp. 737-738.

Primary Examiner—Jose G. Dees
Attorney, Agent, or Firm—Armstrong, Nikaido, Marmelstein, Nikaido & Murray

[57] ABSTRACT

Ultraviolet radiation process applies to manufacture semiconductor devices in order to enhance the thermal stability of the photoresist film on semiconductors wafers.

A method of treating photoresist materials applied in order to enhance the thermal stability of the photoresist film on semiconductor wafer employing heating and ultraviolet irradiation, which meets the demand for improvement in heat resistance and plasma resistance of the photoresists. The initial heating temperature of the photoresist is set to be a little higher than the initial flow temperature, and the temperature of the photoresist is raised in proportion as the flow temperature of the photoresist is increased by exposing the photoresist to ultraviolet radiation and/or heating.

2 Claims, 1 Drawing Sheet

METHOD OF TREATING PHOTORESISTS

This application is a continuation of application Ser. No. 923,505 filed Oct. 27, 1986 now abandoned.

BACKGROUND OF THE INVENTION

1. Field of the Invention

This invention relates to a method of treating photoresist materials applied on semiconductor wafer and, more particularly, to a method of treating the photoresist materials employing heating and ultraviolet irradiation.

2. Description of the Prior Art

In the manufacture of semiconductor devices, a process of forming a photoresist pattern is executed in the sequence of the application of a photoresist material, prebaking, exposure, development and postbaking, when roughly divided. Thereafter, ion implantation, or plasma etching of a silicon oxide film, a silicon nitride film, an aluminum film, etc., which are formed beforehand on the surface of a semiconductor wafer prior to the application of the photoresist material, is executed by using the photoresist pattern. On the occasion, it is preferable that the photoresist has a high heat resistance, since the temperature thereof rises in the process of ion implantation, which it is requisite that the photoresist shows a durability not allowing "film erosion" in the process of plasma etching. However, a photoresist material of high resolution, which has been used in recent years as semiconductor devices are highly integrated and made highly fine, is of a positive type, and the photoresist of this type is generally inferior in the heat resistance to the one of a negative type.

With a view to enhancing the heat resistance and plasma resistance of the photoresist, examinations and studies are made on a method in which a photoresist material is heated gradually to an elevated temperature for a sufficient time in postbaking, and a method in which ultraviolet radiation are applied to a photoresist pattern after development thereof. However, the former method has a fault that it fails to ensure satisfactory heat resistance and plasma resistance and requires to expose the photoresist to ultraviolet radiation for a considerably long time. The latter method, on the other hand, has a fault that, although the heat resistance temperature thereof is raised by exposing the photoresist to ultraviolet radiation, ultraviolet rays do not penetrate to the depth of a film of photoresist material when it is thicker, which results in an insufficient improvement in the heat resistance of the entire film photoresist material and reguires a considerably long exposure time.

In view of these faults, a method of combination of "heating" with "ultraviolet irradiation" has been proposed recently, as is disclosed in Japanese Unexamined Patent Publication ("KOKAI KOHO" in Japan)60-45247 (U.S. Application Ser. No. 497,466) titled "Hardening of Photoresist and Apparatus", for instance. This method, however, is unable to meet the demands for improvements in productivity, throughput,etc. since the temperature of the photoresist is raised below the flow temperature of the photoresist at the time the temperature of the photoresist is raised and then the photoresist ie exposed to ultraviolet radiation, and thus the faults in the aforesaid prior-art still appear as problems therein.

As described above, the prior-art methods for particular treatments of the photoresist, such as hardening the photoresist materisls employing ultraviolet irradiation, have left unsettled the problems that a long exposure time for ultraviolet radiation is required for the treatment and that the improvement in the heat resistance is insufficient in the base portion of the photoresist film when this film is thick, though they have been able to achieve some improvements in the heat resistance and the plasma resistance. In other words, there has been left unsettled a problem that the whole treatment of the photoresist can not be performed in an organic and effective manner.

SUMMARY OF THE INVENTION

An object of this invention is to perform treatments of photoresists effectively by an organic combination of heating with ultraviolet irradiation.

The initial heating temperature of the photoresist is set to be a little higher than the initial flow temperature, and the temperature of the photoresist is raised in proportion as the flow temperature, according to this invention. Therefore, both the heat resistance and the plasma resistance can be improved by the heating and the ultraviolet irradiation in a short time, and thus the productivity is improved remarkably. A particular advantageous effect is that the heat resistance and plasma resistance of the base portion of a photoresist film can be improved sufficiently by ultraviolet rays permeating to the depth of thephotoresist film. Although the temperature rises a little higher than the flow temperature, the change in the shape of a photoresist pattern is so small as 1% or less in dimensions in width of the photoresist, thus causing no hindrance practically.

"The flow temperature" reffered to in this specification means a maximum temperature at which the shape of a photoresist pattern does not change even when the photoresist is kept at the said temperature for 30 minutes. This maximum temperature differs, of course, according to the kind and the film thickness of the photoresist.

In more detail, an exposing the photoresist to ultraviolet radiation is started with the initial temperature of the photoresist set to be higher than the initial flow temperature thereof, and the temperature of the photoresist is raised according as the flow temperature thereof is increased by ultraviolet irradiation, according to this invention.

Moreover, according as the photoresist is exposed to ultraviolet radiation, so the flow temperature rises, that is, the heat resistance of the photoresist is improved, and therefore the photoresist is treated in accordance with an increase in the flow temperature and at a little higher temperature, for instance, several degrees centigrade than the flow temperature. In other words, the temperature of the photoresist rises little by little as it is a little higher than the flow temperature in each step of the exposure, although the temperature of the photoresist is kept higher than the flow temperature, and therefore the shape of the pattern is not impaired virtually. Even if the photoresist is exposed at temperature about 10 nh higher thanthe flow temperature, disorder of the shape of the pattern is about 1% at most of the dimensions in width of the pattern before the treatment. Accordingly, no hindrance is caused even if the photoresist is treated at a little higher tempertute than the flow temperature, and consequently it turns possible to increase the speed of treatment of the photoresist and to improve the productivity. Since the photoresist is treated at high temperature, ultraviolet rays get to the depth of the film of the photoresist material, and thus the heat resistance of the base portion of the film is improved sufficiently even when the film is thick.

Other objects and advantages of this invention will become apparent from the following description of the preferred form of the invention which is illustrated in the drawings accompanying and forming part of this specification.

DESCRIPTION OF THE PREFERRED EMBODIMENT

Figure 1:
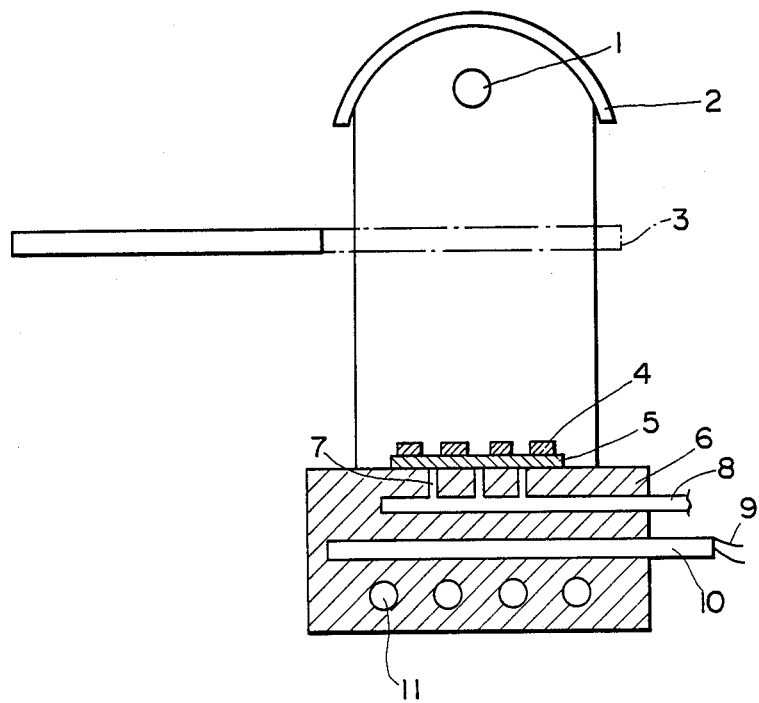
FIG. 1 shows an embodiment of an apparatus for executing method for treatments of photoresists according to this invention.

A preferred embodiment of the invention will be described hereinafter with reference to the accompanying drawings in which FIG. 1 is illustration of an embodiment of an apparatus for executing method of treating photoresists according to this invention.

A pattern of a photoresist 4 is formed on a semiconductor wafer 5, which is placed on a support 6. The support 6 is heated by a heater 10 connected with power supply through a heater lead wire 9, or cooled down by cooling water to flow through a cooling conduit 11. The temperature of the semiconductor wafer 5 is controlled by these heating and cooling mechanisms. Moreover, the support 6 is provided with vacuum adsorption holes 7, a function of which is to fix the semiconductor wafer 5 on the support 6 in close contact with it by the vacuum adsorption connected with a vacuum pump through a connecting conduit 8. A part of ultraviolet irradiation is composed of a high pressure mercury vapor lamp 1, a concave mirror 2, and a shutter 3 which can be opened andclosed. A radiant light containing ultraviolet rays, which is emitted from the high pressure mercury vapor lamp 1, is reflected by the concave mirror 2 or the like and projected onto the photoresist 4 applied on the semiconductor wafer 5. Next, a description will be made on a method of treating the photoresist by using this apparatus of treating the photoresist. The semiconductor wafer 5 coated with the photoresist 4 is placed on the support 6 which is heated beforehand to be in a little higher temperature than a flow temperature, which is the heat resistance temperature of the photoresist 4. Then, the semiconductor wafer 5 is made to contact closely with the support 6 by vacuum adsorption through the vacuum adsorption holes 7. The shutter 3 being opened in this state, the lihgt emitted from the high pressure mercury vapor lamp 1 is projected onto the photoresist 4. While the flow temperature of the photoresist 4 is raised by this exposure, the power of the heater of the support 6 is controlled so that the temperature of the photoresist is a little higher than the flow temperature at the time the temperature of the photoresist is raised. When the treatment of the photoresist is ended, heating is stopped, the shutter 3 is closed, and the exposure to the ultraviolet radiation is stopped. Then, cooling water is flown through the cooling conduit 11 to cool the semiconductor wafer 5 down to a prescribed temperature, and the vacuum adsorption is released so that the semiconductor wafer 5 can be removed from the support 6. After the treatment of the photoresist is completed, the above-described process may be repeated so as to treat the photoresist in sequence.

The following is a more concrete description of the method of treating photoresists.

(1) The initial flow temperature of a positive type photoresist which is formed of a photochemical decomposition agent having a naphthoquinone diazide structure and of phenolic novolak resin and which has a thickness of 1.5 $\mu$m is 120° C. This photoresist was exposed to the ultraviolet radiation with the initial heating temperature of the photoresist set at 125° C. and then raised to 155° C. in 30 seconds. The heating temperature of the photoresist was raised in proportion as the flow temperature, at that time, a change in the shape of a photoresist pattern was 1% or less in dimensions, or did not occur virtually. Meanwhile, the flow temperature increased to 250° C. after the heating and the exposure to the ultraviolet radiation were stopped. This means that the heat resistance temperature was raised to 250° C.

When the initial heating temperature of the photoresist was set at 110° C., i.e. a temperature lower than the initial flow temperature of photoresist of 120° C., and the heating temperature of the photoresist was kept lower constantly than the flow temperature at the time the heating temperature was raised, as was the practice of prior art, on the contrary, heat resistance temperature to 250° C. necessitated 45 seconds of heating and ultraviolet irradiation. In other words, the productivity was improved by 33 to 50% according to this embodiment, and thus a large advantageous result was gained.

(2) A photoresist pattern of thickness 1.4 $\mu$m was prepared by using a HPR204 photoresist (made by Fuji-Hunt Electoronics Technology Corporation). The initial flow temperature of this photoresist was 125° C. The initial heating temperature of the photoresist was set at 130° C. and the heating temperature of the photoresist raised to 180° C. in 20 seconds while being kept a little higher constantly than the flow temperature, and the photoresist was exposed to ultraviolet radiation.

As the result, the flow temperature increased to 200° C. after the heating and the exposure to ultraviolet radiation were stopped. In other words, the heat resistance temperature was improved to 200° C. When the initial heating temperature of this photoresist was set at 110° C., for instance, and the temperature of the photoresist was kept lower constantly than the flow temperature at the time the heating temperature was raised as was the practice of the prior art, on the contrary, an improvement of the heat resistance temperature to 200° C. necessitated 30 seconds of heating and ultraviolet irradiation. In other words, the productivity was improved by 33 to 50% also in this embodiment, and thus a large advantageous result was gained.

In the same way as in the foregoing embodiment, the change in the shape of a photoresist pattern was 1% or less in dimensions, and it was confirmed that no hindrance was caused thereby practically, although the heating temperature was kept a little higher than the flow temperature at the time the heating temperature was raised.

The rise in the temperature of the photoresist can be controlled with ease by a method wherein the data on the flow temperature are taken beforehand and the power of the heater is controlled by a relatively simple computer in which said data on the temperature are stored.

What is claimed is:

1. A method of enhancing the thermal stability of a developed photoresist image on a semiconductor wafer comprising the steps of:
   placing said semiconductor wafer on a support being exposed to ultraviolet radiation and having means for controlling the temperature of said developed photoresist image,
   initially heating the developed photoresist image to a temperature greater than the initial flow temperature of said photoresist image and exposing said photoresist image to ultraviolet radiation to increase the flow temperature of said photoresist image,
   continuing said exposure of said photoresist image to ultraviolet radiation while increasing the temperature of said photoresist image to maintain said temperature of said photoresist image above the increased flow temperature of said photoresist image during at least a portion of said continued exposure of said photoresist image to said ultraviolet radiation, and
   controlling the temperature of said photoresist image to permit only minimal change in the shape of said photoresist image.

2. The method of claim 1, wherein said minimal change in the shape of said photoresist image is no greater than 1%.

* * * * *